United States Patent [19]
Wendell

[11] Patent Number: 5,430,399
[45] Date of Patent: Jul. 4, 1995

[54] RESET LOGIC CIRCUIT AND METHOD

[75] Inventor: Dennis L. Wendell, Pleasanton, Calif.

[73] Assignee: Sun Microsystems, Inc., Mountain View, Calif.

[21] Appl. No.: 49,063

[22] Filed: Apr. 19, 1993

[51] Int. Cl.$^6$ .................... H03K 19/20; H03K 3/26
[52] U.S. Cl. .................... 326/121; 327/198; 327/208
[58] Field of Search ............ 307/451, 443, 594, 272.3

[56] References Cited

U.S. PATENT DOCUMENTS

| | | | |
|---|---|---|---|
| 4,513,329 | 4/1985 | Gomez et al. | |
| 4,728,820 | 3/1988 | Lee | 307/448 |
| 4,806,786 | 2/1989 | Valentine | 307/448 |
| 4,985,643 | 1/1991 | Proebsting | 307/451 |

FOREIGN PATENT DOCUMENTS

| | | |
|---|---|---|
| 0318929A3 | 6/1989 | European Pat. Off. |
| 0347759A2 | 12/1989 | European Pat. Off. |
| 0498895A1 | 8/1992 | European Pat. Off. |
| 02124632 | 5/1990 | Japan |

OTHER PUBLICATIONS

Technische Rundschau, vol. 68, No. 51, Dec. 1976, Bern Ch., pp. 9–11, P. Blomeyer, "Kleines LSL-Praktikum", (p. 9, Para 2.2.2, FIG. 19).

Primary Examiner—David R. Hudspeth
Assistant Examiner—Andrew Sanders
Attorney, Agent, or Firm—James W. Rose

[57] ABSTRACT

A high speed inverter circuit is disclosed. The inverter has a quiescent state, a set state for receiving an input pulse and generating a set pulse in response thereto, a reset stage in which a delayed version of the same input pulse is used to reset the inverter, and a recovery state for preparing the inverter for the arrival of a new input pulse. The inverter has an extremely fast switching speed because virtually all of the available energy of the input signal is used to set the inverter. The inverter may be used in an inverter chain for rapidly propagating electrical signals.

19 Claims, 3 Drawing Sheets

RESET LOGIC CIRCUIT AND METHOD

BACKGROUND OF THE INVENTION

1. Field of the Invention

The present invention relates to an inverter, and, more particularly, to an inverter with extremely fast switching characteristics and which may be used as a building block in numerous high speed circuit applications.

2. Description of the Prior Art

The CMOS inverter is a basic building block in modern microelectronics. Multiple inverters are used to construct standard logic gates such as NAND gates and NOR gates. Inverters may also be used for numerous other applications, such as a clock generator circuit or a decoder circuit.

A standard CMOS inverter includes an NMOS transistor and a PMOS transistor. The gates of the two transistors are coupled to an input node. The source-drain current channel of the PMOS transistor is coupled between Vcc and an output node. The source-drain current path of the NMOS transistor is coupled between the output node and ground. When a logical high signal is applied to the input node, the PMOS transistor is turned off and the NMOS transistor is turned on. As a result, the output node is inverted and pulled down to ground. When a logical low signal is applied to the input node, the complement of the above occurs and the output node is pulled up to Vcc.

The standard CMOS inverter has a significant problem regarding switching speed. For a given channel width and turn on voltage, an NMOS transistor is approximately twice as conductive as a PMOS transistor. To ensure that the inverter has approximately the same delay for both high to low and low to high transitions, the channel width of the PMOS transistor is typically made twice as large as the NMOS transistor. As a consequence, for any given input signal, one third (⅓) of the charge is used to drive the NMOS transistor and two thirds (⅔) of the charge is used to drive the PMOS transistor. The switching speed of the CMOS inverter is impaired because a significant portion of the available charge is used to perform non-productive work, i.e., the turning off of one of the transistors. The conventional CMOS inverter is therefore no longer ideal for use in many circuit applications, such as high speed microprocessors.

A form of CMOS circuitry with improved speed characteristics is the "post charge logic" technique described in U.S. Pat. No. 4,985,643 to Robert J. Proebsting. This patent describes a chain of logic stages. Each stage includes a set transistor and a reset transistor. The set transistor of each stage is responsible for forward propagating an input pulse through the chain. In one embodiment, the reset of each stage is accomplished by a feedback signal from a set transistor of a subsequent stage in the chain. In a second embodiment, a four stage inverter chain (hereafter referred to as a reset chain) is used to reset each stage. The reset chain receives an active pulse during the set phase of the stage, and, four delays later, the pulse is used to reset the stage in anticipation of the next pulse. Both configurations have the advantage of eliminating the need of turning off the reset transistor of an active stage while forward propagating the signal pulse through the set transistor of that stage. The two post charge logic configurations, however, have significant disadvantages.

In the feedback embodiment, a metal trace feedback interconnect is required for every stage in the chain. Numerous metal trace feedback paths are very complicated and difficult to lay out and use up valuable space on the die. Another drawback is that a portion of the forward propagation signal, albeit less than in conventional CMOS, is still being used for non-productive work. For each stage, a certain percentage of the available energy is used to reset a previous stage via the feedback interconnect. Finally, given that a particular stage is responsible for driving a subsequent stage, a reset node of a previous stage, and in some situations, a circuit load, a circuit designer must calculate the fanout delay of the particular stage to equal that of the other stages in the chain. This can be a time-consuming task with chips that contain a large number of post charge logic circuits and stages.

The inverter chain embodiment also has a number of drawbacks. A total of four conventional inverters, (equivalent to eight transistors) is required for each reset chain of each stage. These additional transistors may use up valuable space on the die, creating lay out problems. In certain applications, these additional transistors may also consume the limited power available on the chip. It is also very difficult to tune each reset chain so that the reset time period for each stage is the same. As you progress down the chain of stages, the transistors of each stage (including the reset chain) generally become physically larger. Temperature variations, process variations, variations in supply voltage and the differences in the rise and fall time of the input signals also affect the switching speed of the transistors. Each of these factors complicate the tuning process.

In a complex circuit with many post charge logic stages, the effort to overcome the fan out delay and/or the tuning problems is burdensome. A substantial amount of time is required to determine the optimal size and switching characteristics of the transistors in the post charge logic circuit. Many circuit designers have thus been discouraged from using this technique.

SUMMARY OF THE INVENTION

The present invention provides a CMOS inverter useful for high speed circuit applications. The basic inverter according to the present invention includes a set transistor and a reset circuit. The set transistor forward propagates a set signal at a set node in response to the receipt of an input signal. A delay circuit is also provided to delay the arrival of the input signal at the reset circuit. The delay is for a period of time sufficient to allow the set transistor to forward propagate the set signal. The reset circuit resets the set circuit after the delay and forward propagates a reset signal at a reset node. A recovery circuit prepares the inverter to receive a new input signal after the inverter has been reset.

In one embodiment of the present invention, a plurality of the inverters are arranged in a chain. In such a chain, the first inverter is similar to that described above. The subsequent inverters include a set transistor and a reset transistor. A delay circuit is not required for the subsequent stages. The set transistor receives the set signal from the previous inverter and generates its own set signal in response thereto. This set signal is used to drive the next inverter in the chain. The reset transistor then receives the delayed reset signal from the previous inverter and resets the inverter. The reset signal is then forward propagated to the next inverter in the chain, where the set transistor is turned off. In this manner, each stage in the chain is rapidly set and then reset as the set signal and reset signal respectfully propagate through the chain.

The inverter chain of the present invention has a number of advantages over the prior art. At each inverter stage, virtually all the energy of the set signal is used to drive the set transistor. This results in an exceptionally fast propagation time from stage to stage because no energy is wasted on the reset function. Rather, the reset signal delayed by the delay circuit of the first stage function propagates through and resets each stage in the chain after the set signal. This is advantageous because all the fanout and tuning problems associated with a feedback path or a reset chain for each stage is eliminated. The size and switching characteristics of transistors in the inverter can be determined by the load the inverter is driving. Accordingly, the inverter of the present invention may be readily used as a basic building block in many of today's high speed applications, such as for circuit design in microprocessors, semiconductor memory devices, or any chip requiring high speed logic.

DESCRIPTION OF THE DRAWINGS

The objects, features and advantages of the circuit and method of the present invention will be apparent from the following description in which.

DESCRIPTION OF THE PREFERRED EMBODIMENT

Figure 1:
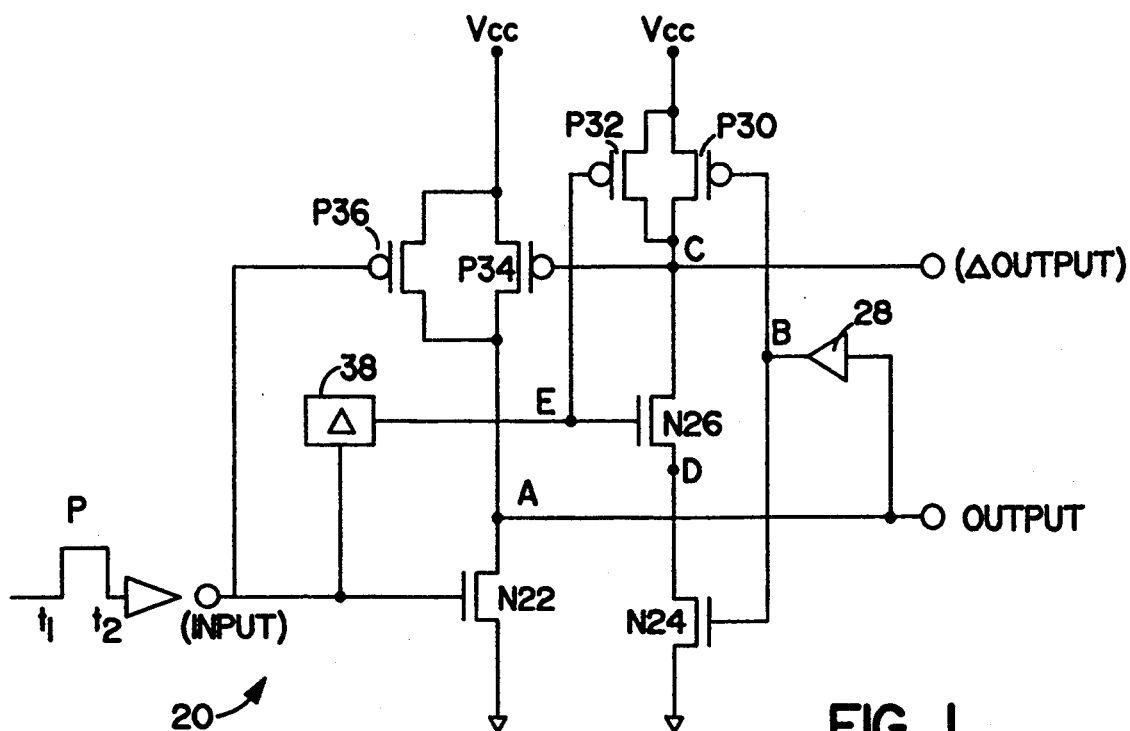
FIG. 1 illustrates an inverter according to the present invention.

Referring to FIG. 1, a CMOS inverter according to the present invention is shown. The inverter 20 may be used in a chain of inverters according to one embodiment of the present invention. This first inverter is described in detail with respect to FIG. 1. The other inverters in the chain are described in detail with respect to the other figures of the present application.

The inverter 20 includes NMOS transistor N22, NMOS transistor 24, NMOS transistor N26, inverter 28, PMOS transistor P30, PMOS transistor P32, PMOS transistor P34, PMOS transistor P36 and delay circuit 38 having a delay $\Delta t$. The gate of N22 is coupled to the input node, and its source-drain current path is coupled between node A (set node) and ground. The gate of N24 is coupled to node B, and its source-drain current path is coupled between node D and ground. The gate of N26 is coupled to node E (reset input node), and its source-drain current path is coupled between node C and node D. The inverter 28 has its input coupled to node A and its output coupled to node B. The gate of P30 is coupled to node B, and its source-drain current path is coupled between Vcc and node C. The gate of P32 is coupled to node E, and its source-drain current path is coupled between Vcc and node C. The gate of P34 is coupled to node C, and its source-drain current path is coupled between Vcc and node A. The gate of P36 is coupled to the input node, and its source-drain current path is coupled between node Vcc and node A. Delay circuit 38 is coupled between the input node and node E.

It is useful to note that the delay $\Delta t$ of circuit 38 is equal to or is slightly greater than the width of pulse P (t1–t2) received at the input node of the inverter. The delay circuit 38 may include one or more conventional inverters or any other type of delay circuit, such as an RC delay, a schmitt trigger, a counter, or the like. The timing of inverter 28 should be equal to or less than the pulse width P.

The inverter 20 operates in four states: the quiescent state; the set state; the reset state; and the recovery state. In the quiescent state, the circuit 20 is inactive and is waiting for a pulse P at the input node. The set state occurs when the inverter 20 receives a positive transition of the pulse P at the input node, and in response thereto, generates a negative transition at the set node A. The reset state occurs when the positive transition of the input pulse P, which is delayed by circuit 38, arrives at the reset input node E. This causes a negative transition at the node C. Finally, in the recovery state, the inverter 20 is readied for a new pulse by a transition into the quiescent state. A detailed description of the four states of operation is provided below.

In the quiescent state, a pulse P is not present at the input node, and, therefore, the inverter 20 is inactive. P36 is on and N22 is off, pulling up the set node A to Vcc. With its input high, inverter 28 pulls down node B to ground. N24 is therefore off, while P30 is turned on, pulling up reset node C to Vcc, which in turn shuts off P34. Node E is also low, resulting in N26 being off and P32 being on, thereby enhancing the pull up of reset node C. Thus, in the quiescent state of the inverter 20, the set node A and the node C are both held high while the input node is low.

The set state is triggered by the arrival of a pulse P at the input node. When the pulse P arrives at the input node, N22 is turned on and set node A is pulled down to ground (the falling edge). The pulse P is therefore inverted at the set node A during the period (t1–t2). It is useful to note the status of the other transistors of the inverter 20 in the set state. Node B transitions from ground to Vcc due to inverter 28. P30 is shut off, while N24 is turned on and node D is pulled down to ground. Node E, however, remains low during the set state because the circuit 38 delays the input pulse P. N26 therefore remains off, while P32 remains on maintaining node C at Vcc, which in turn, maintains P34 off.

The reset state is triggered by the arrival of the delayed pulse P at node E. By this time, the pulse P is no longer present at the input node since the delay of circuit 34 is equal to or slightly longer than the duration of the input pulse. N22 is therefore turned off. The pulse P at reset input node E causes N26 to turn on and P32 to turn off. Transistor P30 was previously turned off during the set state in preparation for the resetting of the inverter. Reset node C is pulled down to ground because both N24 and N26 are on. As a result, P34 is turned on and node A is reset as it is pulled up to Vcc. The resetting of the inverter 20 causes the termination (the rising edge) of the inverted pulse P at the set node A.

The recovery state is required to prepare the inverter 20 for a new input pulse P. Recovery occurs after the reset of the circuit. Recovery is controlled by inverter 28. When node A is reset from ground to Vcc, node B is pulled down to ground by inverter 28. As a result, P30 is turned on, reset node C is pulled up to Vcc and P34 which controls the potential at node A is turned off. Consequently, the circuit is in the quiescent state and is ready for another pulse P at the input node.

It is useful to note that the delay or fanout characteristics for the set path and the reset path of the inverter are identical. The negative pulse at node C (reset pulse) follows the negative pulse at node A by a delay of approximately $\Delta t$.

Figure 2:
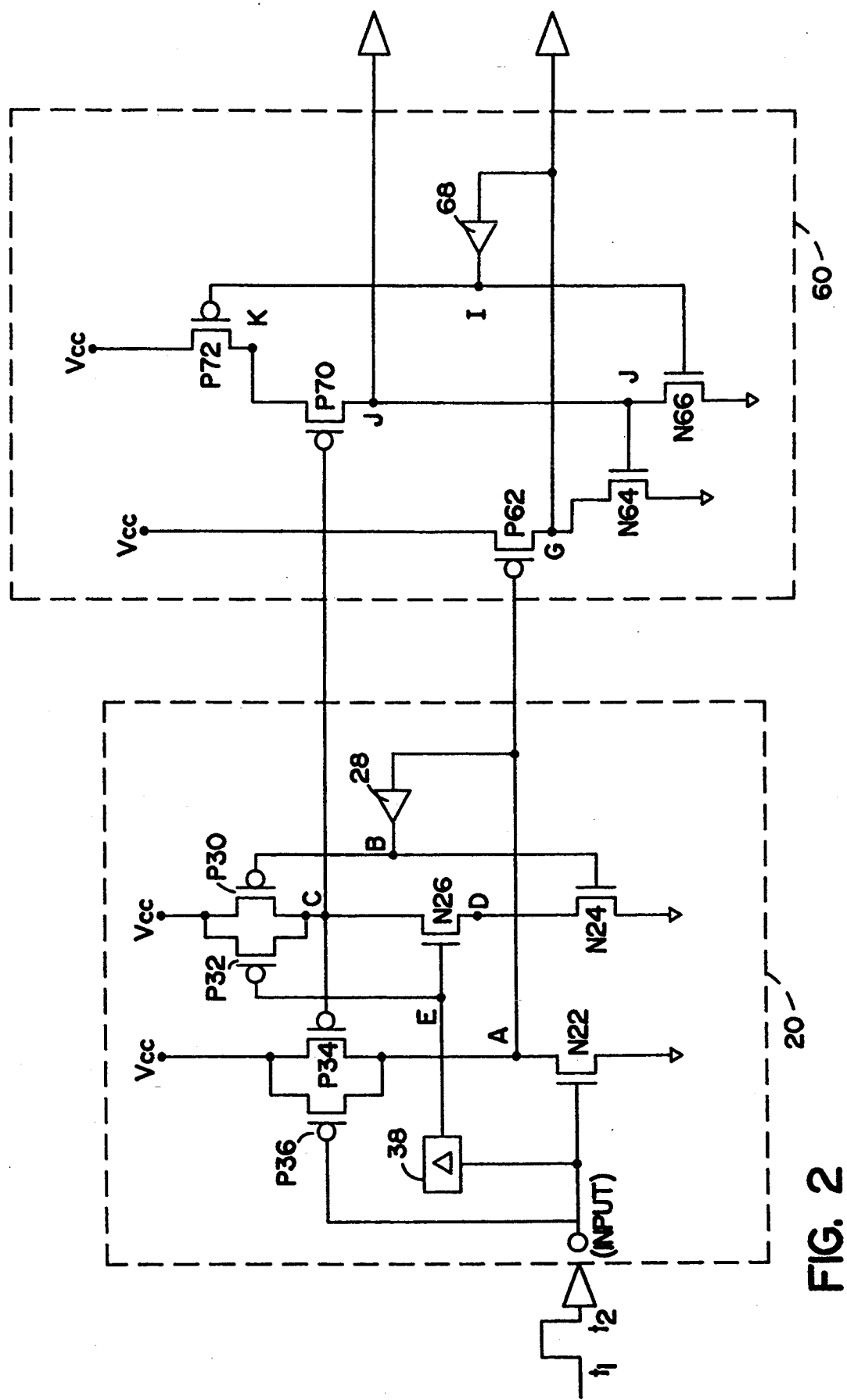
FIG. 2 illustrates a two stage inverter chain according to the present invention.

Referring to FIG. 2, a chain of two inverters is shown. The chain includes the first inverter 20 and a second inverter 60. The set pulse generated at node A of the first inverter is used to drive the subsequent inverter 60 into the set state, and the delayed reset pulse generated at node C is used to reset the second inverter 60 after the set pulse.

The second inverter 60 includes PMOS transistor P62, NMOS transistor N63, NMOS transistor N64, NMOS transistor N66, NMOS transistor N67, inverter 68, PMOS transistor P70, and PMOS transistor P72. The gate of P62 is coupled to node A, and its source-drain current path is coupled between Vcc and set node G. The gate of N63 is coupled to node A, and its source-drain current paths is coupled between node G and ground. The gate of N64 is coupled to reset node J, and its source-drain current path is coupled between set node G and ground. The gate of N66 is coupled to node I, and its source-drain current path is coupled between reset node J and ground. The gate of N67 is coupled to node C, and its source-drain current path is coupled between node H and ground. The inverter 68 has its input coupled to set node G and its output coupled to node I. The gate of P70 is coupled to node C, and its source-drain current path is coupled between node K and reset node J. The gate of P72 is coupled to node I, and its source-drain current path is coupled between Vcc and node K. The second inverter 60 is complementary to that of inverter 20 since it receives negative pulses from nodes A and C.

In the quiescent state, a set pulse P is not present at node A, and, therefore, the inverter 60 is inactive. The inverter 60 enters the set state when a set pulse P occurs at node A. P62 then turns on and set node G is rapidly pulled up to Vcc. The second inverter 60 is triggered into the reset state when the delayed reset pulse at node C occurs. The reset pulse turns on P70 which pulls up the reset node J to Vcc. N64 is turned on and set node G is pulled down to ground. The set pulse is thus terminated. Node I is pulled up to Vcc by inverter 68 as node G is reset to ground. Node J is then pulled down to ground as a result, terminating the reset pulse. The inverter is thus recovered and returned to its quiescent state.

It is again useful to note that fanout characteristics of positive pulse P at reset node J is identical to that of the set pulse at set node G. The pulse at node J follows that at node G by a period of ($\Delta t$). The set pulse at node G may again be used to drive a third inverter into set operation, and the delayed reset pulse at node J can be used to reset that same inverter. It would be obvious to one skilled in the art to string as many inverters together as needed to create a high speed circuit.

Figure 3:
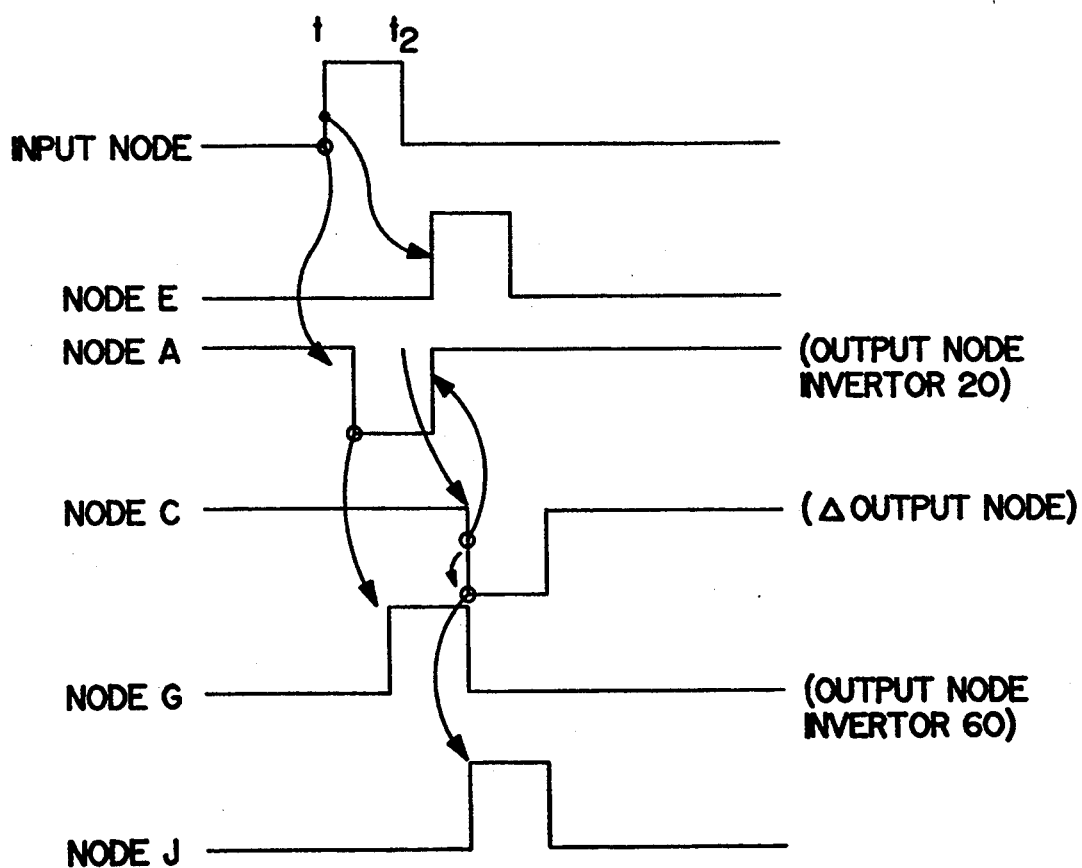
FIG. 3 illustrates a timing diagram of the inverter chain of FIG. 2 according to the present invention.

Referring to FIG. 3, a diagram illustrating the timing relationship of the potential of the various nodes of inverter 20 and inverter 60 is shown. In the quiescent state of inverter 20, the input node and node E are low, and set node A and reset node C are at Vcc. In the set state of inverter 20, the input node rises for the duration of the width of pulse P, causing the transition of set node A from Vcc to ground. Reset node C and node E remain unchanged in the set state. In the reset state, node E transitions from ground to Vcc. This causes set node A to transition from ground to Vcc and for reset node C to change from Vcc to ground. In the recovery stage, reset node C returns to Vcc. The other nodes of inverter 20 remain unchanged.

The transition from Vcc to ground at set node A of the first inverter 20 causes the set node G of inverter 60 to transition from ground to Vcc. The transition of node C from Vcc to ground causes inverter 60 to enter the reset state, and set node G returns to ground while reset node J changes from ground to Vcc. The transition of node C from ground to Vcc prepares the second inverter for another forward set signal at node G.

Figure 4:
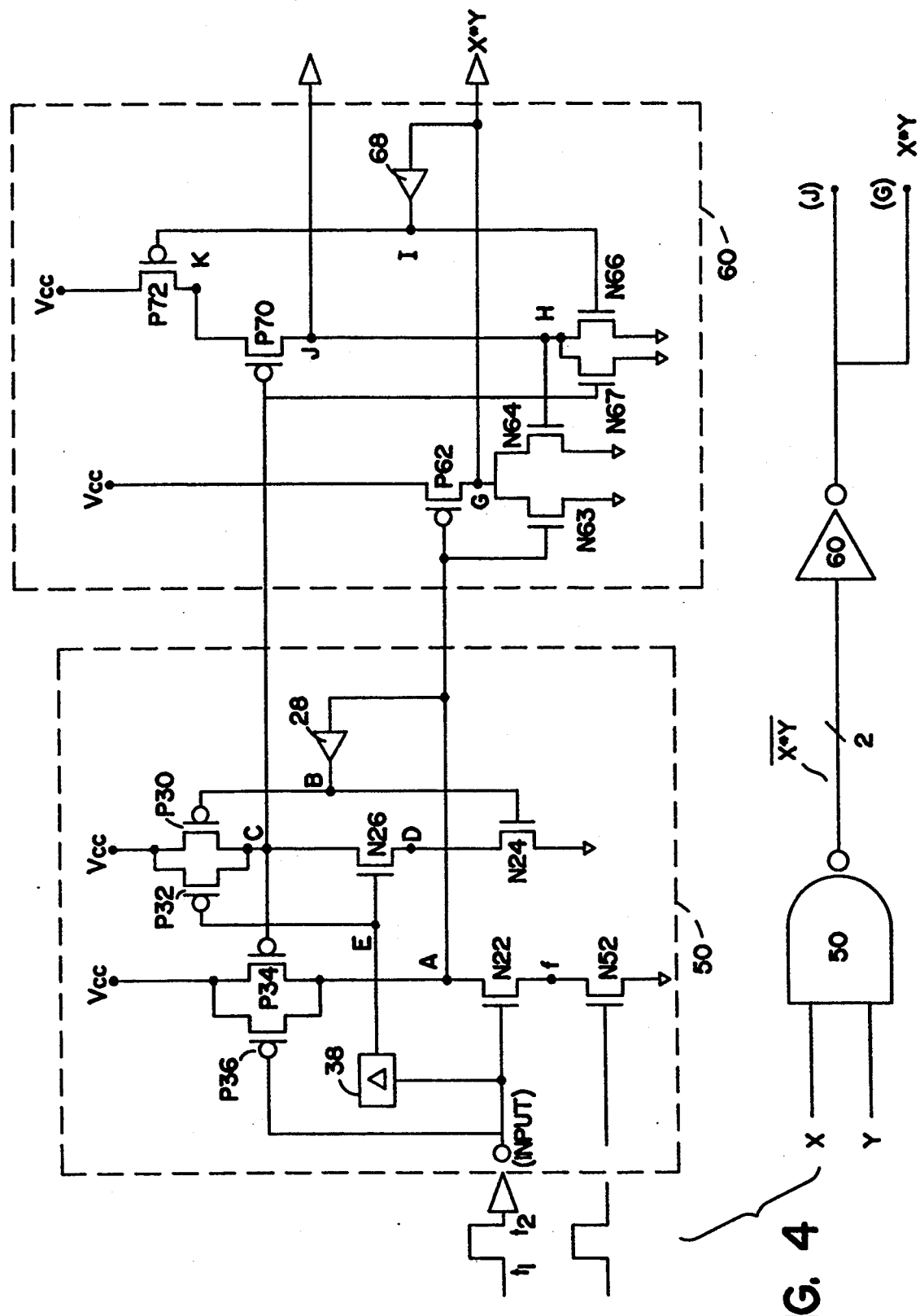
FIG. 4 illustrates logic circuit designed using the inverter of the present invention.

The inverter chain of the present invention can be easily modified to create logic gates. Referring to FIG. 4, a NAND 50 gate derived from first inverter 20 is shown. An additional NMOS transistor N52 is added to the inverter circuit 20 to obtain the functionality of NAND gate 50. The gate of N22 is coupled to receive an X input signal, and the source drain current path is coupled between node A and node F. The gate of N52 is coupled to receive a Y input, and the source-drain current path is coupled between node F and ground. This configuration implements a NAND gate function. Only when both the X and Y inputs are true, is set node A pulled down to ground, causing the inverter 20 to enter the set state. For all other possible input combinations (X=true and Y=false), (X=false and Y=true), or (X=false and Y=false), the inverter 20 remains in the quiescent state. The second inverter 60 then inverts the output of NAND gate 50 to obtain an AND function.

The construction of OR gates, NOR gates and other combinations of logic circuits would be readily apparent to one skilled in the art. In the design of alternate logic gates, it may be necessary to add additional delay circuits to other inputs into the gate and modify the reset network. The inverters can also be used to build a variety of high speed circuits, such as clock pulse generators and decoder circuits. It will be obvious to one skilled in the art to use this circuit technique for numerous applications.

In an alternative embodiment, the delay circuit 38 of the NAND gate 50 may be replaced with a standard CMOS inverter. This modification provides several advantages.

The NAND gate 50 will no longer be strictly pulse driven. It may instead be driven by two input signals which occur at roughly the same time. Furthermore, the NAND gate may stay in one state (set or reset) for the duration of the input signals, which may be longer than the cycle time of the system. It would be readily apparent to those skilled in the art that inverter 10, and other circuits such as OR gates built using the basic technique described herein could be modified in a similar manner.

The CMOS inverter could also provide another advantage in situations wherein a subsequent stage is physically located at a distant point on the die from the previous stage in a chain. Under these circumstances, the CMOS inverter could be used to eliminate the problem of matching the RC delays on the set path and reset path between the two stages. This is accomplished by removing the reset path wire connection between the two stages. A CMOS inverter is coupled between the set input node and the reset input node (i.e., in place of delay circuit 38). When the first transition of the set pulse occurs at the subsequent stage, the subsequent stage enters the set mode. The subsequent stage is then reset when the second transition of the set pulse occurs. To prevent premature resetting of the subsequent stage, the time delay of the inverter 28 should be greater than the delay of the added CMOS inverter.

While the invention has been described in relationship to the embodiments shown in the accompanying Figures, other embodiments, alternatives and modifications will be apparent to those skilled in the art. It is intended that the specification be only exemplary, and that the true scope and spirit of the invention be indicated by the following claims.

What is claimed is:

1. A circuit, comprising:
    a set circuit for receiving an input signal and for generating a set signal in response thereto, the set circuit comprising a set transistor configured to receive the input signal at its control electrode;
    a delay circuit for generating a delay signal derived from the input signal;
    a reset circuit, coupled to the delay circuit, for receiving the delay signal, and in response thereto, resetting the set circuit; and
    a recovery circuit, coupled to the set circuit, for preparing the set circuit to receive a new input signal.

2. The inverter of claim 1, wherein the delay circuit comprises at least one inverter.

3. The inverter of claim 1, wherein the reset circuit generates a reset signal in response to the delayed input signal.

4. The inverter of claim 3, herein the reset signal is generated after the set signal.

5. A chain of two inverter stages, comprising:
    a first inverter having a first set circuit for receiving an input signal and providing a set signal in response thereto; and a first reset circuit for receiving a second input signal and for generating a reset signal in response thereto; and
    a second inverter having a second set circuit responsive to the set signal from the first inverter and a second reset circuit responsive to the reset signal from the first inverter.

6. The inverter chain of claim 5, wherein the first set circuit of the first inverter comprises a set transistor configured to receive the input signal.

7. The inverter chain of claim 6, wherein the second set circuit of the second inverter comprises a second set transistor for receiving the set signal from the first set circuit of the first inverter.

8. The inverter chain of claim 5, wherein the first reset circuit of the first inverter further comprises a first reset transistor for receiving the second input signal and in response thereto, for resetting the first set circuit and for forwarding the reset signal to the second inverter.

9. The inverter chain of claim 5, wherein the reset signal is generated after the set signal.

10. A method of operating a circuit comprising the steps of:
    receiving an input signal at an input node of a first stage of a circuit and generating a set signal at a set node in response thereto;
    generating a delay signal derived from the input signal received at the first stage;
    receiving the delay signal at the first stage, and in response thereto, resetting the set node of the first stage and generating a reset signal;
    receiving the set signal from the first stage at a second set node of a second stage; and
    receiving the reset signal from the first stage at the second stage, and in response thereto, resetting the second set node of the second stage.

11. The method of claim 10, wherein the reset signal is generated after the set signal.

12. The method of claim 10, further comprising the step of preparing the first stage for receiving a new input signal.

13. A method of propagating a signal through a chain of inverters, comprising:
    providing a plurality of inverters in a chain, each of the inverters having a set node and a reset node;
    coupling the set nodes of each of the inverters in the chain;
    coupling the reset nodes of each of the inverters in the chain;
    forwarding a set signal to the set node of each of the inverters in the chain;
    generating a reset signal after the input signal; and
    forwarding the reset signal to the reset node of each of the inverters in the chain to reset the set node of each of the inverters.

14. A chain of two circuit stages, comprising:
    a first stage having a first set circuit for receiving an input signal and providing a set signal in response thereto; and a first reset circuit for receiving a delayed version of the input signal and for resetting the first stage; and
    a second stage having a second set circuit responsive to the set signal from the first stage and a second reset circuit responsive to an inverted version of the set signal from the first stage.

15. A method of propagating a signal through a chain of logic stages, comprising:
    providing a plurality of stages in a chain, each of the stages having a set node and a reset node;
    coupling in sequence the set nodes of each of the stages in the chain;
    applying and propagating a set signal to the set node of each of the stages in the chain; and
    inverting the set signal and applying the inverted set signal to the reset node of each of the stages in the chain to reset the set node of each of the stages after it has been set.

16. A circuit comprising:
    a first stage, the first stage including:
        an input node;
        a set circuit, coupled to the input node, for receiving an input signal at the input node and for generating a set signal in response thereto; and
        a reset circuit, coupled between the input node and the set circuit, for generating a reset signal derived from the input signal and for resetting the set circuit and for causing the set circuit to generate a reset signal; and
    a second stage, the second stage including:
        a second set circuit, for receiving the set signal from the set circuit of the first stage and for being set in response thereto; and
        a second reset circuit for receiving the reset signal from the reset circuit of the first stage and for being reset in response thereto.

17. The circuit of claim 16, wherein the set circuit of the first stage implements a logic function.

18. The circuit of claim 17, wherein the set circuit of the first stage is coupled to receive a second input signal.

19. The circuit of claim 17, wherein the set circuit of the first stage generates the set signal only when the outcome of the logic function is true.

* * * * *